(12) United States Patent
Nishi

(10) Patent No.: US 6,948,245 B2
(45) Date of Patent: Sep. 27, 2005

(54) GEAR AND METHOD OF MAKING THE SAME

(76) Inventor: Takashi Nishi, 906-213, 8-14 Takezono 1-chome, Tsukuba-shi, Ibaraki (JP), 306-0032

( * ) Notice: Subject to any disclaimer, the term of this patent is extended or adjusted under 35 U.S.C. 154(b) by 272 days.

(21) Appl. No.: 10/149,055

(22) PCT Filed: Dec. 4, 2000

(86) PCT No.: PCT/JP00/08573
§ 371 (c)(1),
(2), (4) Date: Jun. 24, 2002

(87) PCT Pub. No.: WO01/42131
PCT Pub. Date: Jun. 14, 2001

(65) Prior Publication Data
US 2004/0049918 A1 Mar. 18, 2004

(30) Foreign Application Priority Data
Dec. 6, 1999 (JP) .......................................... 11-376344

(51) Int. Cl.[7] .............................................. B23P 15/14
(52) U.S. Cl. ..................... 29/893.31; 29/893; 29/893.3; 29/893.37
(58) Field of Search ................................ 29/893.3, 893, 29/893.31, 893.37; 74/384, 386, 458, 459.5, 460; 216/54; 310/99, 103

(56) References Cited

U.S. PATENT DOCUMENTS 3,298,219 A * 1/1967 Schober ........................ 72/377
2003/0135979 A1 * 7/2003 Nishi ........................ 29/592.1
2004/0026366 A1 * 2/2004 Sharon et al. ................. 216/52

FOREIGN PATENT DOCUMENTS

| JP | 06-049670 | * | 2/1994 |
| JP | 6151547 | | 5/1994 |
| JP | 07-054968 | * | 2/1995 |
| JP | 7055515 | | 3/1995 |
| JP | 7177761 | | 7/1995 |
| JP | 7191209 | | 7/1995 |
| JP | 8127074 | | 5/1996 |
| JP | 8174563 | | 7/1996 |
| JP | 8281519 | | 10/1996 |
| JP | 9056146 | | 2/1997 |

OTHER PUBLICATIONS

JP 08–127074 JPO English Machine Translation. JPO. 1996.*

* cited by examiner

Primary Examiner—Eric Compton
(74) Attorney, Agent, or Firm—Jordan and Hamburg LLP

(57) ABSTRACT

In order that a worm 1 is rotated, a clearance (a region constituting a clearance portion between bearings and a worm gear) is formed (FIGS. 4(1) to (3)) in an upper surface of a base plate 3. A mold 12 for forming a lower half region of the worm therein is formed (FIG. 4(8)). A material 5 for the worm is deposited (FIG. 4(9)) to a height equal to that of a lower half region plus that of an upper half of the worm. An upper half of the worm is formed (FIGS. 4(10) to (12)). Finally, the material 13 in the clearance between the base plate 3 and gear 1 is removed (FIG. 4(13)).

4 Claims, 12 Drawing Sheets

PRIOR ART

GEAR AND METHOD OF MAKING THE SAME

TECHNICAL FIELD

This invention relates to gears of the sizes in the order of submicron to centimeter applied to a micro-machine, and more particularly to gears obtained by forming one of projection type teeth, magnetic teeth and electrostatic teeth on circumferential surfaces of worms the axes of rotation of which are horizontal, perpendicular or inclined with respect to their base plate surfaces, or spur gears the axes of rotation of which are horizontal or inclined with respect to their base plate surfaces, or bevel gears the axes of rotation of which are perpendicular, horizontal or inclined with respect to their base plate surfaces; and a method of manufacturing the same gears.

BACKGROUND ART

A combination of a worm and a worm gear used in a regular machine is shown as an example of a gear in FIG. 18. A spur gear placed with the axis of rotation thereof set perpendicular to its base plate surface as shown in FIG. 17, and provided with projections on a circumferential surface thereof has a shape easily formed by the film formation techniques and fine processing techniques used in a related art semiconductor process. However, a gear other than such spur a gear and having a complicated shape, for example, a gear having helical teeth, such as a worm is not being manufactured.

A gear having magnetic teeth instead of projection type teeth on a circumferential surface thereof is proposed in Japanese Patent Laid-Open No. 56146/1997. The magnetic teeth of this kind of gear are formed on a flexible base plate by using a semiconductor process separately from a gear base. The flexible base plate on which the magnetic teeth are formed is thereafter wound around a gear base to complete a magnetic gear. However, according to this method, gears of sizes in the order of up to around millimeter can be manufactured but it is difficult to manufacture gears of sizes in the order of micron and submicron.

A driving actuator (motor) to be incorporated in a micromachine demands to be microminiaturized. A microminiaturized actuator generates a low power. In order to operate a micromachine with a low generated power, it is necessary that power transmission gearing having a high reduction ratio be provided in its power transmission path. The abovementioned gears, i.e. a gear having projections on a circumferential surface thereof, a gear with magnetic teeth formed on a circumferential surface thereof and a gear with electrostatic teeth formed on a circumferential surface thereof are effectively used for this gearing.

The present invention provides gears mentioned above and formed on various base plates, such as a silicon base plate, a glass base plate, a ceramic base plate, a plastic base plate, a metal base plate and the like.

The gears to which the present invention is applied are a gear capable of being formed on a front surface and a rear surface and in an inner portion of a base plate, having projections on a circumferential surface thereof and rotated with other gear meshed therewith, or a magnetic gear rotated by a magnetic force, or an electrostatic gear rotated by an electrostatic force. In the case of the spur gear shown in FIG. 15, the gear is formed of a complicatedly shaped gear, for example, a helically shaped worm shown in FIGS. 1 and 2, a spur gear shown in FIG. 7 the axis of rotation of which is parallel to a base plate surface, a spur gear the axis of rotation of which is inclined, a bevel gear shown in FIG. 9 and an inclined bevel gear, etc., which are other than a spur gear the axis of rotation of which is parallel to a base plate surface, and these complicatedly shaped gears are indispensable to the practical utilization of a micromachine.

The present invention has been made in view of these points, and provides worms the axes of rotation of which are perpendicular, inclined and horizontal with respect to base plates thereof, spur gears the axes of rotation of which are horizontal and inclined with respect to base plates thereof, and bevel gears the axes of rotation of which are inclined, perpendicular and horizontal with respect to base plates thereof on all of which teeth of one of a gear having projections on a circumferential surface thereof, a gear having magnetic teeth on a circumferential surface thereof and a gear having electrostatic teeth on a circumferential surface thereof, which could be microminiaturized as gears for transmitting power to a micromachine, are provided by making use of the film formation techniques and fine processing techniques used in a semiconductor process; and a method of manufacturing these gears.

DISCLOSURE OF THE INVENTION

The method of manufacturing gears according to the present invention is adapted to separately manufacture upper and lower halves, which are to be joined to each other at their opposed cross-sectionally circular portions, of a worm the axis of rotation of which is horizontal or inclined with respect to a base plate, including the steps of forming a lower half molding flask having the shape of a cross-sectionally semicircular worm, depositing a metal or other material for forming a gear portion and an upper half of the gear in the molding flask, and forming the deposited material to the shape of the upper half of the worm by etching the same material.

Another method of manufacturing gears according to the present invention is a method of manufacturing a worm the axis of rotation of which is perpendicular to or inclined with respect to a base plate surface, adapted to form one stage or not larger than one stage of a helical body, for example, a half thereof at a time, and piling up the helical structures. In this method, a circumferential surface portion of the gear can also be formed out of a material different from the material for a gear body so that the circumferential portion has a projection type shape. After forming a desired helical structure, a groove portion made of a material different from the material for the gear and base plate is removed by wet etching to complete the gear. A worm the axis of rotation of which is inclined with respect to a base plate surface can be manufactured by inclining the worm body at an arbitrary angle with respect to a base plate surface while one stage or not larger than one stage, for example, a half of the helical structure is formed at a time.

Still another method of manufacturing gears according to the present invention is a method of manufacturing a spur gear the axis of rotation of which is horizontal to or inclined with respect to a base plate surface, by using a manufacturing procedure identical with that used in the manufacturing of horizontal worm, i.e., by forming a lower half of the gear first, and then an upper half thereof.

A further method of manufacturing gears according to the present invention is a method of manufacturing a bevel gear the axis of rotation of which is perpendicular to a base plate surface, the bevel gear being able to be made by one film formation and processing step, a gear horizontal with respect to a base plate surface or a bevel gear inclined with respect the same being made half at a time, i.e., the upper and lower halves of the gear being made separately. A gear having such a shape that does not permit the gear to be formed at even upper and lower halves thereof separately is formed by using a method of molding a smaller part of the gear at a time.

BEST MODE FOR CARRYING OUT THE INVENTION

The present invention will be described in detail in accordance with what are shown in the attached drawings.

The embodiments of the present invention will be described with reference to the drawings.

A worm using magnetic teeth and electrostatic teeth is gearing formed by combining a hand drum type worm gear and a spur gear type worm gear together in addition to a columnar gear, or gearing formed by combining a barrel type worm gear and a dish type worm gear together.

Projection type teeth, magnetic teeth and electrostatic teeth are made by film formation techniques and fine processing techniques, which are used in a semiconductor process and the like, with a gear body of a worm, worm gear, spur gear, bevel gear, etc. The film formation techniques include vacuum evaporation, a sputtering method, a plating method and the like, while the fine processing techniques include photolithography, an etching method and the like. Furthermore, the techniques obtained by suitably combining these techniques can be used in practice.

(First Embodiment)

Figure 1:
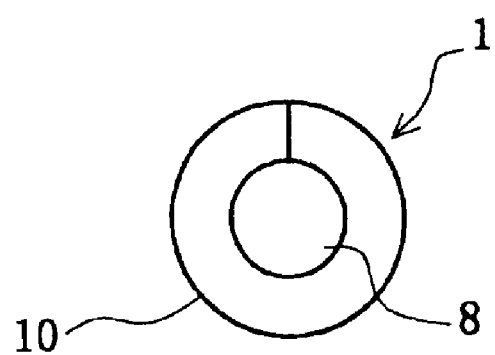
FIG. 1 is a top view of a columnar worm.
Figure 2:
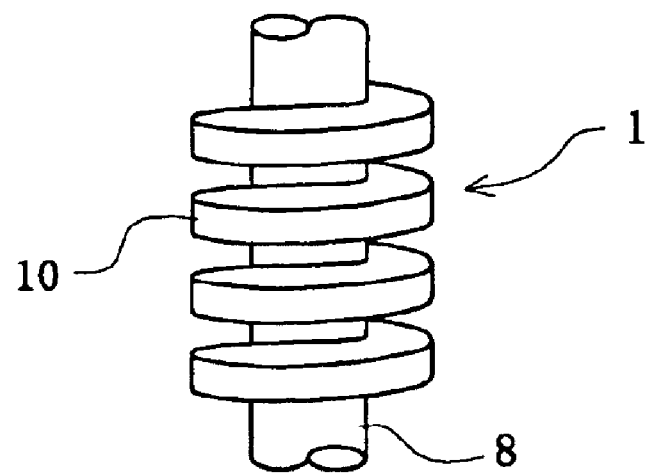
FIG. 2 is a side view of the columnar worm.
Figure 3:
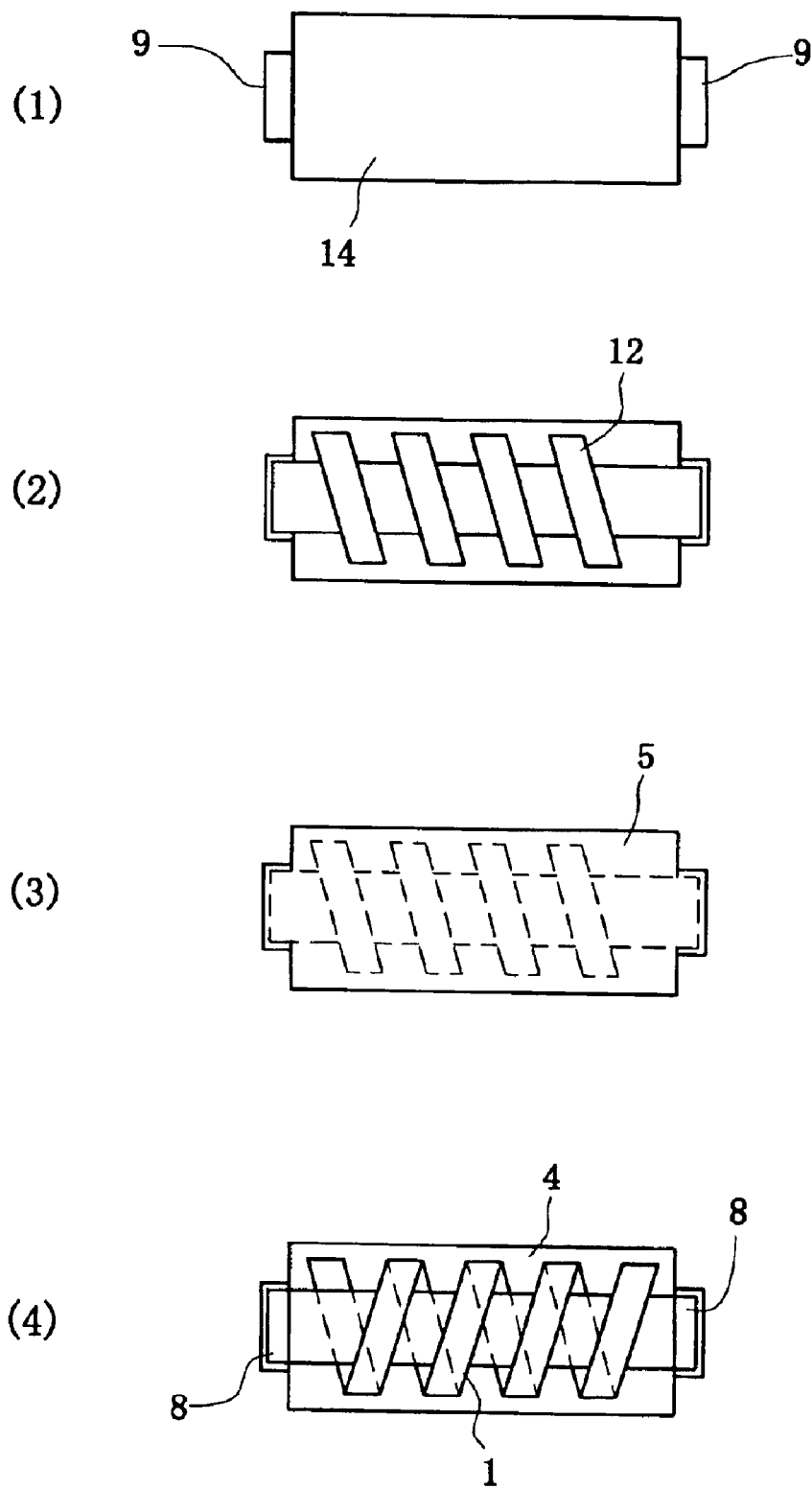
FIG. 3 is a plan view for describing the method of manufacturing a worm, the axis of rotation of which is horizontal with respect to a base plate surface, to be used for a micromachine in a first embodiment of the present invention.

A method of manufacturing a worm the axis of rotation of which is horizontal with respect to a base plate surface will be described. FIG. 3 is an explanatory drawing illustrating in plan the procedure for manufacturing such a worm.

This worm is manufactured by carrying out in order a step (FIG. 3(1)) of forming recesses (bearing portions 9 and a region 14 constituting a clearance 4 between a worm gear and sides of a base plate 3) on the base plate 3, so as to rotate the worm 1, a step (FIG. 3(2)) of forming molds 12 used to form a lower half region of the worm 1, a step (FIG. 3(3)) of depositing a material 5 for the worm 1 to the height equal to that of the lower half region formed in the step of (FIG. 3(2)) plus an upper half of the worm 1, and a step (FIG. 3(4)) of forming the upper half of the worm 1.

Figure 4:
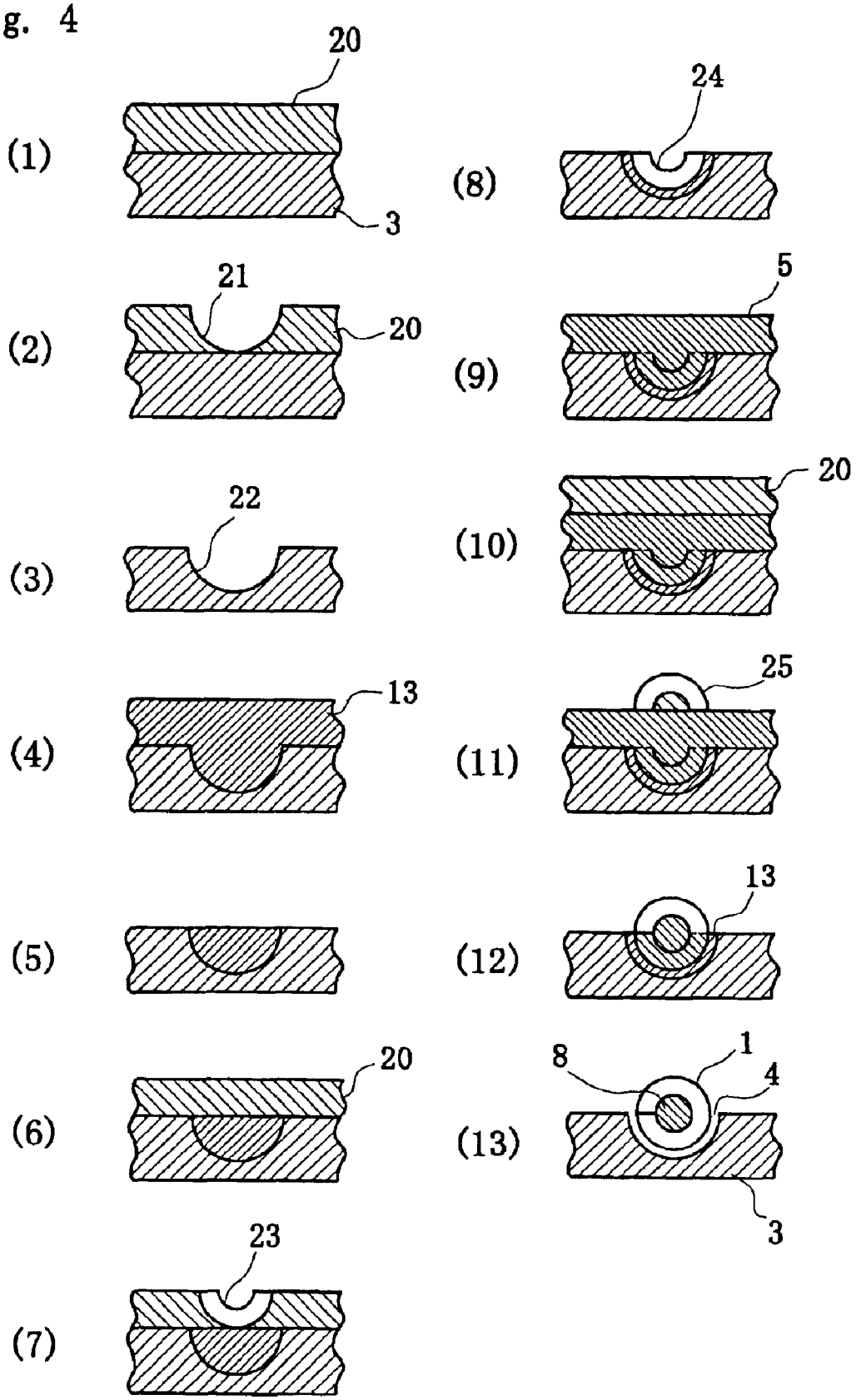
FIG. 4 is a sectional view for describing the method of manufacturing a worm, the axis of rotation of which is horizontal with respect to a base plate surface, to be used for a micromachine in the first embodiment of the present invention.

Each of these steps will now be described in detail. FIGS. 4(1) to (13) are sectional views showing the procedures for manufacturing a worm.

Concerning forming the region 14, which constitutes the void 3 between the worm gear and sides of the base plate, in such a manner that the gear can be rotated, a photosensitive agent 20 is applied (FIG. 4(1)) to an upper surface of a base plate 3 first. The photosensitive agent may not be applied directly to the base plate. Other material may be deposited on the base plate, and a gear may be formed on this deposited material.

A pattern is drawn (FIG. 4(2)) on the photosensitive agent 20 by using EB direct exposure, a reflective exposure system or a projection exposure system and the like. During the drawing of the pattern, an exposure value of the photosensitive agent is controlled by regulating an electron beam or a light shielding film on a mask, in such a manner that the photosensitive agent 20 comes to have a semicircular cross-sectional shape 21 as shown in the drawing. Namely, in the EB direct exposure, the electron beam is applied to resist by varying the quantity of the electron beam continuously, and the photosensitive agent is developed, the resist being thereby processed so that the resist has an arbitrary inclined or curved cross-sectional shape. There is also a method of forming a worm by holding down the quantity of the electron beam and changing the number of application of the electron beam.

Next, in the reflective exposure system or projection exposure system, a worm of a desired shape is formed by regulating a quantity of reflected light on a mask in use by a method of setting the thickness of the light shielding film, a method of setting the arrangement of fine holes formed in the light shielding film, or a method of a combination of these methods, and thereby continuously controlling the exposure value. This method will hereinafter be referred to as an exposure value control method. In addition to this method, directly etching a material with an ion beam or a laser beam also enables a worm to be formed.

An etching operation 22 is carried out (FIG. 4(3)) so that the etching can be done perpendicularly to a base plate surface with the photosensitive agent 20, which was formed in the step of FIG. 4(2), used as a mask, and so that etching rates of the photosensitive agent and a material to be etched, i.e. those of a material of the base plate and photosensitive agent in this embodiment become equal to each other. This method will hereinafter be referred to as a transfer etching method.

A material 13 different from that for the gear is deposited (FIG. 4(4)).

The region of the material 13 deposited in the step of FIG. 4(4) which is other than a groove-packing region is removed (FIG. 4(5)).

A mold for a lower half of the gear is then formed. First, a photosensitive agent 20 is applied (FIG. 4(6)) to the base plate so that a thickness of the photosensitive agent becomes equal to a radius of the gear.

A mold 23 for a lower half of the gear is exposed, developed and cured (FIG. 4(7)) by the same exposure control method as was used in the step of FIG. 4(2).

A mold 24 for a lower half of the gear is transfer formed (FIG. 4(8)) by transfer etching the material by the same method as was used in the step of FIG. 4(3).

Next, a gear is formed.

A material 5 for the gear is deposited on the base plate 3 (FIG. 4(9)). The thickness of a film of the material 5 used at this time is set so that the largest thickness of a gear-forming region be equal to the diameter of the gear.

A photosensitive agent 20 is applied to this material (FIG. 4(10)). The thickness of the photosensitive agent is regulated so as to become equal to the radius of the gear.

On the photosensitive agent 20 thus applied to the material, an upper half 25 of the gear is formed (FIG. 4(11)) by an exposure value control method.

The shape of the upper half 25 of the gear formed at an upper portion by a transfer etching method is transfer formed (FIG. 4(12)) on a ground material by etching.

Finally, the material 13 existing between the base plate 3 and gear 1 is removed to form a clearance 4, and the gear is thereby rendered rotatable (FIG. 4(13)).

Besides the columnar worm, various types of worms, such as a hand drum type worm, a barrel type worm and the like can also be formed.

(Second Embodiment)

Figure 5:
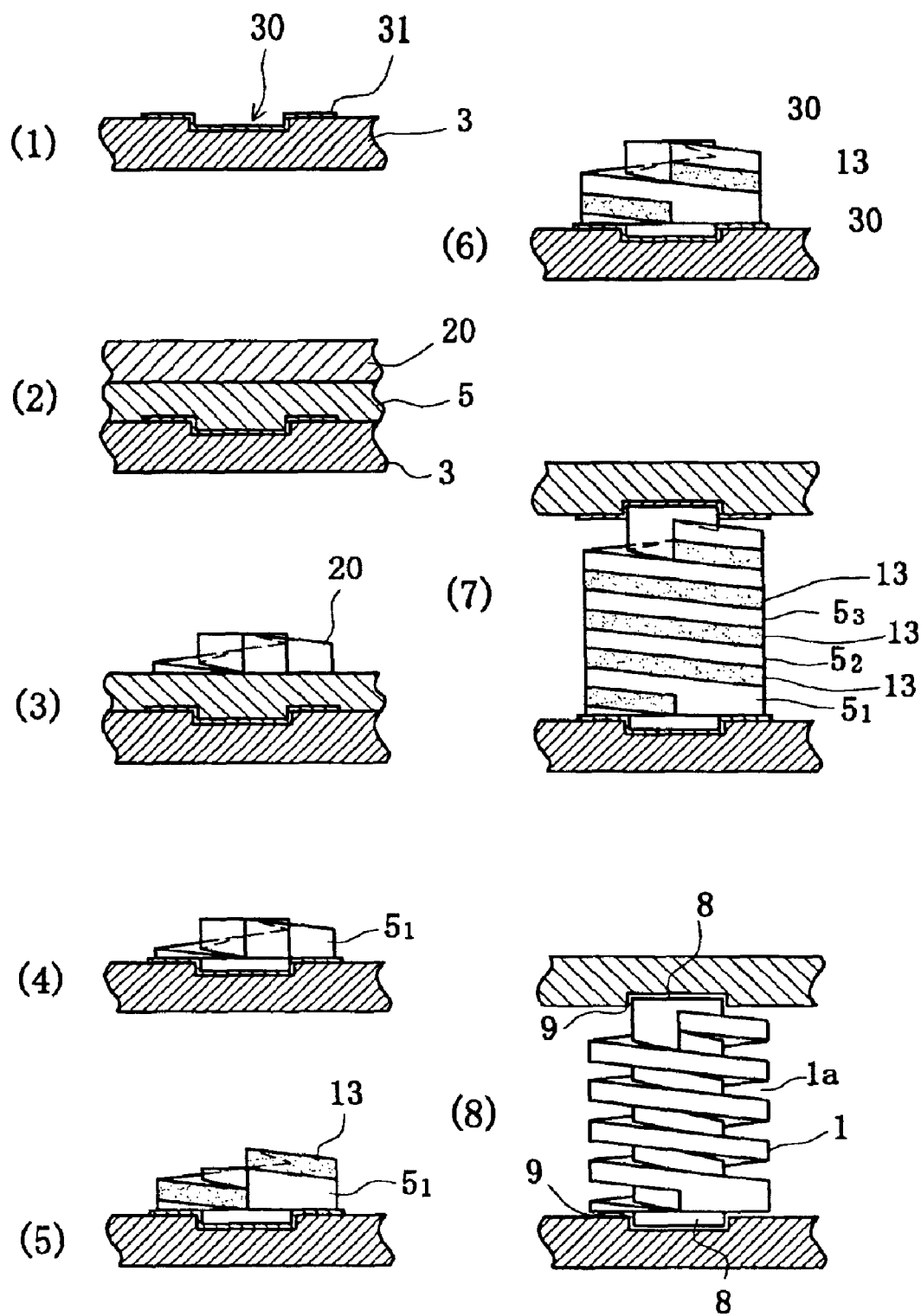
FIG. 5 is a sectional view for describing the method of manufacturing a worm, the axis of rotation of which is perpendicular to a base plate surface, to be used for a micromachine in a second embodiment of the present invention.

A method of manufacturing a worm the axis of rotation of which is perpendicular to a base plate surface will be described. FIG. 5 is a sectional view showing the procedure for manufacturing this worm.

FIGS. 5(1) to 5(4) shows a step of making a base of helixes.

In order to rotate a gear, a portion 31 corresponding to a clearance between a bearing portion 30 and a base plate 3 is formed (FIG. 5(1)).

A material 5 for the gear and a photosensitive agent 20 are deposited (FIG. 5(2)) on the base plate 3 to a thickness equal to the height of one stage of the base of helixes.

The shape of the photosensitive agent 20 is exposed by the exposure value control method to form one helical turn (FIG. 5(3)).

The photosensitive agent 20 is transfer etched to form (FIG. 5(4)) a base $5_1$ of the gear.

A portion corresponding to a groove 1a of the gear 1 is then formed. This groove 1a is formed by depositing a material 13 different from the gear forming material 5 on a front surface of the base plate, and then a resist on this deposited material. The resultant product is exposed, developed and etched by using a regular mask on which a ring type pattern is drawn in a photolithographic step, to form the groove so that the material 13 remains therein. After the etching operation finishes, the resist is removed (FIG. 5(5)).

The portions constituting projecting portions of the gear and a central portion of the gear are then formed. Namely, the material 5 for the gear is deposited, and these portions are made (FIG. 5(6)) by the same method as is used in the steps of FIGS. 5(2) to (4).

The step of FIG. 5(5) and step of FIG. 5(6) are then carried out repeatedly until a desired number of teeth $5_1, 5_2, 5_3 \ldots, 5_n$ are formed, to make teeth in a piled manner (FIG. 5 (7)). These piled teeth are formed out of a material 13 different from that 5 of the gear. A material 31 corresponding to an upper clearance portion is then deposited between upper bearing portions, and bearing portions are formed thereon.

Finally, the material 31 joined to upper and lower portions is removed (FIG. 5(8)). As a result, a structure capable of being rotated as a worm gear is formed. Although a rotary shaft 8 and bearing portions 9 are shown parallel to each other in FIG. 5(8) which shows a completed worm gear, it is possible to form each of these parts so as to have a curved surface for the purpose of reducing friction, sharpen one of the parts, and change the shapes of the parts. It is also possible to form ball bearings between the rotary shaft 8 and bearing portions 9 by an exposure value control method and a transfer etching method.

Figure 6:
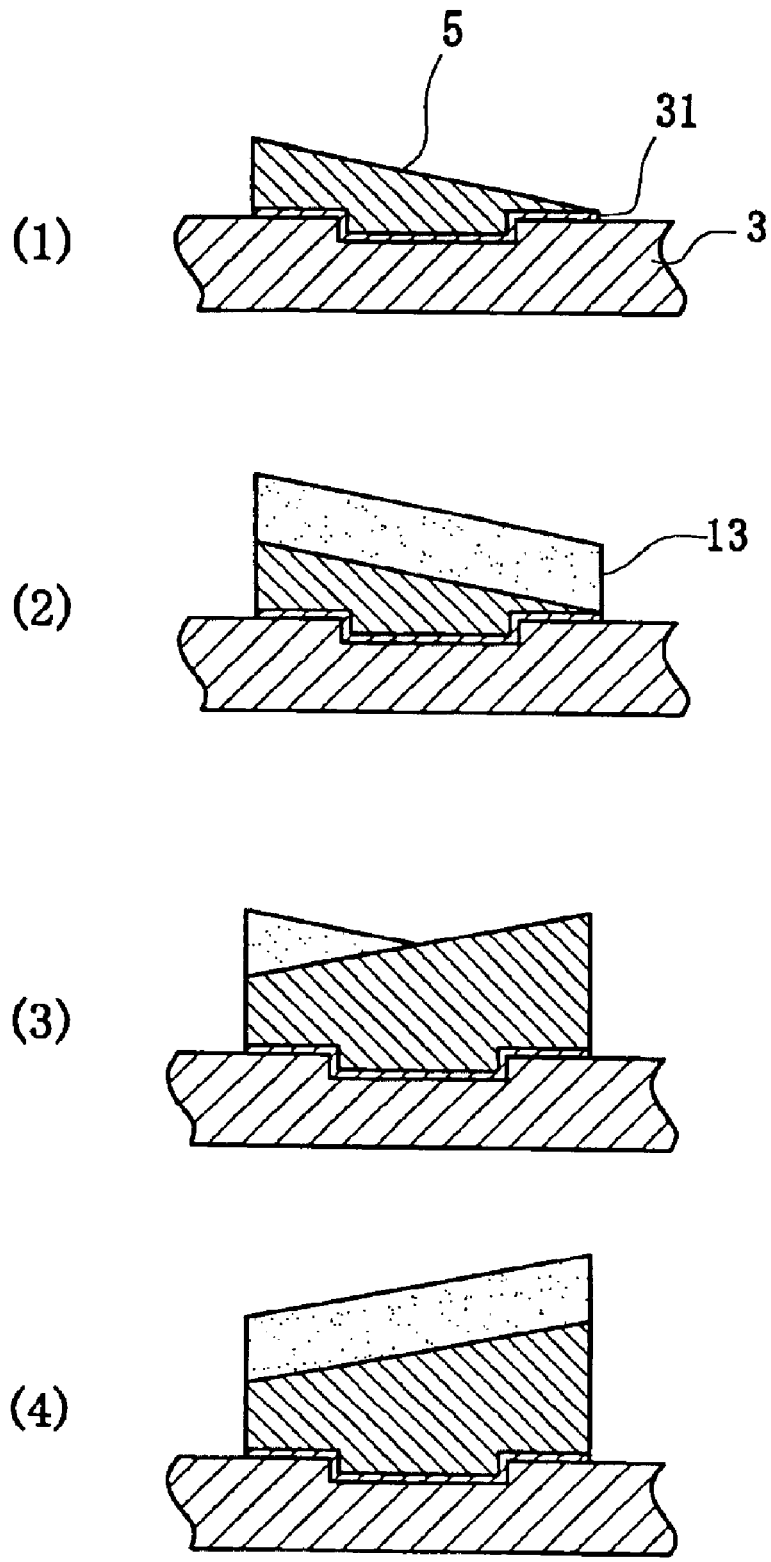
FIG. 6 is a sectional view for describing another method of manufacturing a worm, the axis of rotation of which is perpendicular to a base plate surface, to be used for a micromachine in the second embodiment of the present invention.

Another method different from the above-mentioned method will be described. FIG. 6 illustrates a method, which is different from the above method, of making a worm the axis of rotation of which is perpendicular to the base plate surface.

In order to rotate a gear, a bearing portion and a portion 31 corresponding to a clearance between a base plate 3 and gear are formed. A tooth portion having a surface inclined in one direction is then formed (FIG. 6(1)) out of a material 5 for the gear. A groove portion of the gear and a half a ring corresponding to a portion of magnetic teeth or electrostatic teeth is formed (FIG. 6(2)) out of a material 13 different from the material 5 for the gear. In order to form the other half of the ring, a tooth portion having a surface inclined in the direction opposite to the direction of inclination of the first-formed half and a groove portion (magnetic tooth and electrostatic tooth) are then formed (FIGS. 6(3) and (4)). These steps are then carried out alternately to form a gear having a desired number of teeth.

Besides a columnar worm, various shapes of worms including a hand drum type worm, a barrel type worm and the like can also be formed.

(Third Embodiment)

A method of manufacturing a spur gear the axis of rotation of which is horizontal with respect to a base plate surface will be described. This embodiment is directed to a spur gear having four projections.

Figure 7:
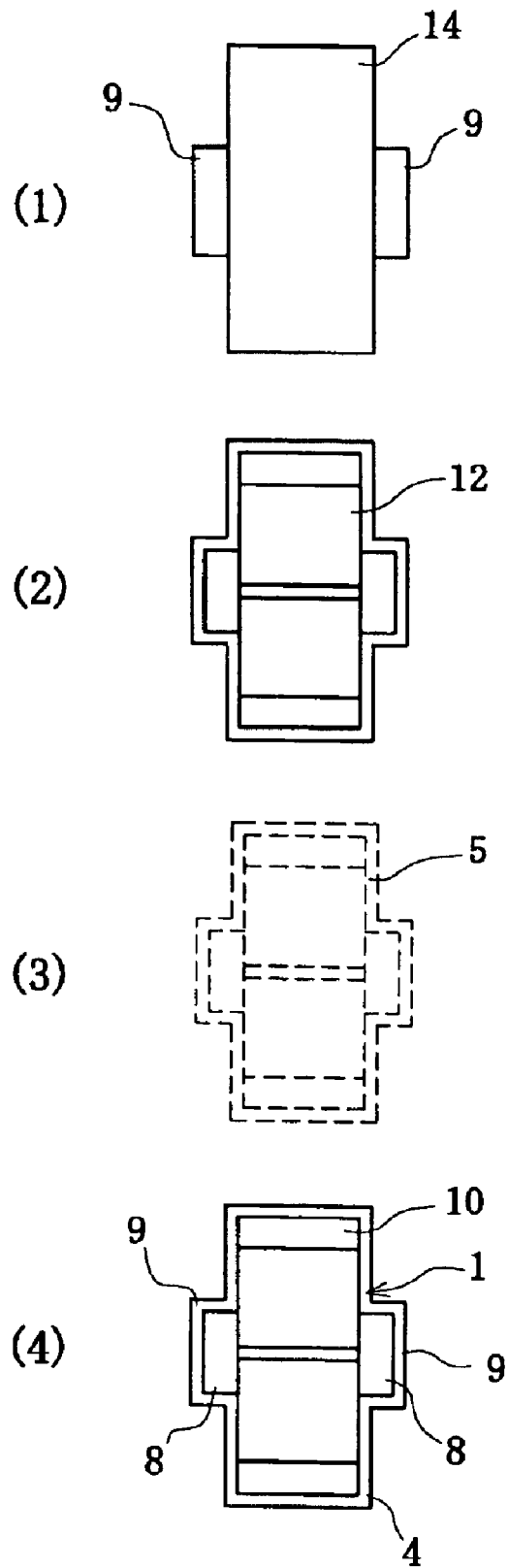
FIG. 7 is a plan view for describing the method of manufacturing a spur gear, the axis of rotation of which is horizontal with respect to a base plate surface, to be used for a micromachine in a third embodiment of the present invention.

This spur gear is formed by carrying out successively in order to rotate the gear a step (FIG. 7(1)) of forming a region 14 of a clearance portion 4 between the base plate and gear and bearing portions 9, a step (FIG. 7(2)) of forming a molding flask 12 for a lower half of the gear, a step (FIG. 7(3)) of depositing a gear-forming material 5, and a step (FIG. 7(4)) of forming an upper half of the gear.

Figure 8:
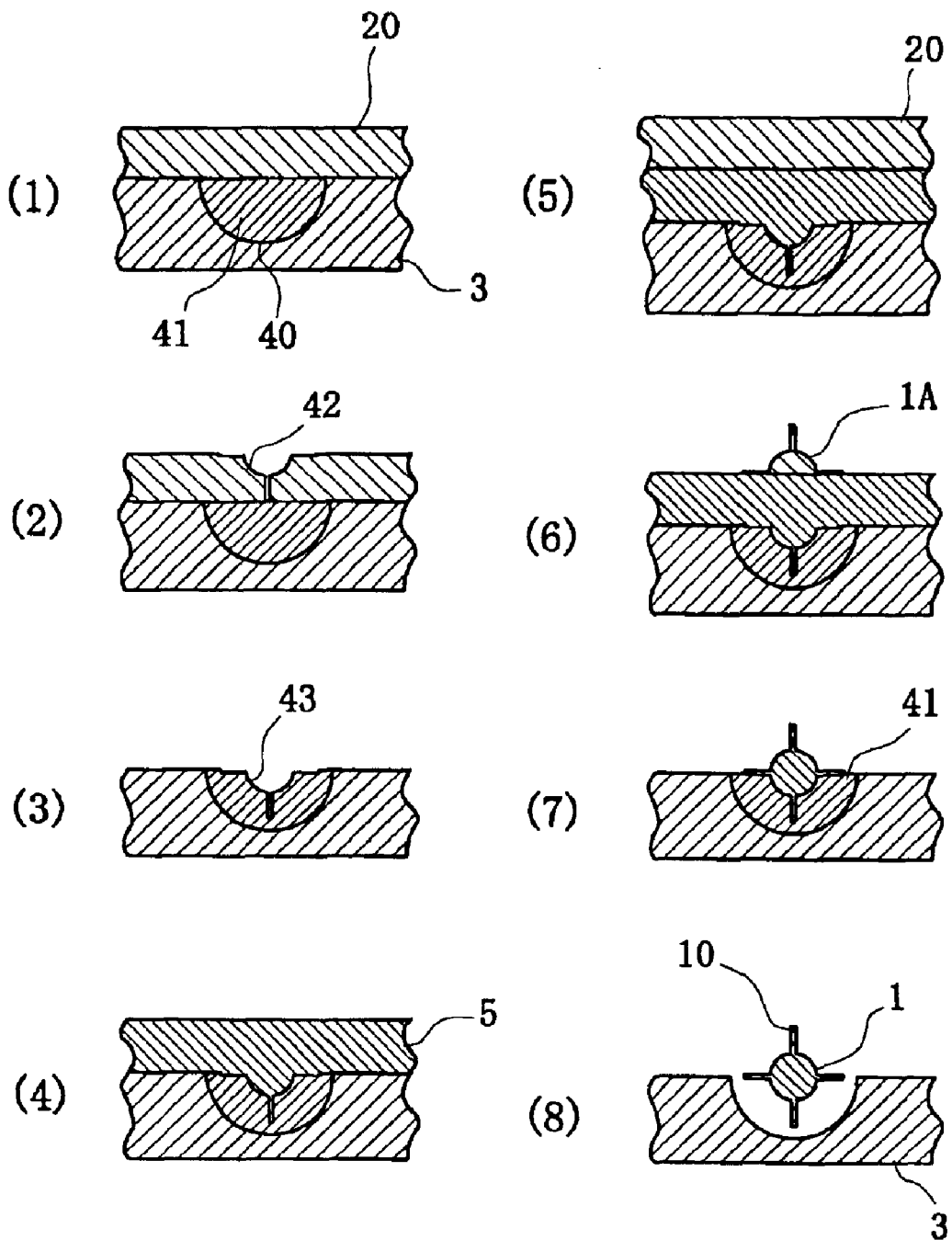
FIG. 8 is a sectional view for describing the method of manufacturing a spur gear, the axis of rotation of which is horizontal with respect to a base plate surface, to be used for a micromachine in the third embodiment of the present invention.

Each of these steps will be described in detail. FIGS. 8(1) to (8) are sectional views showing the procedure for manufacturing a spur gear.

In order that a spur gear can be rotated, a groove 40 is made in a base plate 3, and filled with a material different from those for the gear 1 and base plate 3. A photosensitive agent 20 is applied (FIG. 8(1)) to an upper surface of the base plate thus formed.

The photosensitive agent is exposed by an exposure value control method, and a lower half 42 of the spur gear is formed (FIG. 8(2)).

A molding flask 43 corresponding to a lower half of the gear is formed (FIG. 8(3)) by a transfer etching operation.

A material 5 for the gear is deposited (FIG. 8(4)) to a thickness equal to a diameter of the gear 4.

A photosensitive agent 20 is applied (FIG. 8(5)) to the material 5 to a thickness equal to a radius of the gear.

The shape 1A of the upper half of the gear is formed (FIG. 8(6)) by the exposure value control exposure.

A ground material is transfer etched to form (FIG. 8(7)) the gear 1.

The material 41 in the clearance between the base plate 13 and gear 1 is removed (FIG. 8(8)).

Although a spur gear having four projections is shown in this embodiment, spur gears having projections the number of which is other than four can also be formed.

(Fourth Embodiment)

Figure 9:
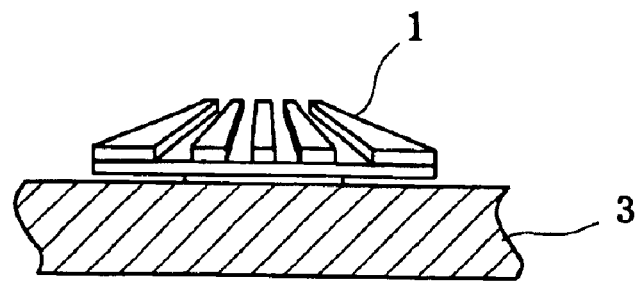
FIG. 9 is a side view for describing a bevel gear, the axis of rotation of which is perpendicular to a base plate surface, to be used for a micromachine in the third embodiment of the present invention.

A method of manufacturing a bevel gear the axis of rotation of which is perpendicular to a base plate surface will be described. FIG. 9 is a side view of the bevel gear.

Figure 10:
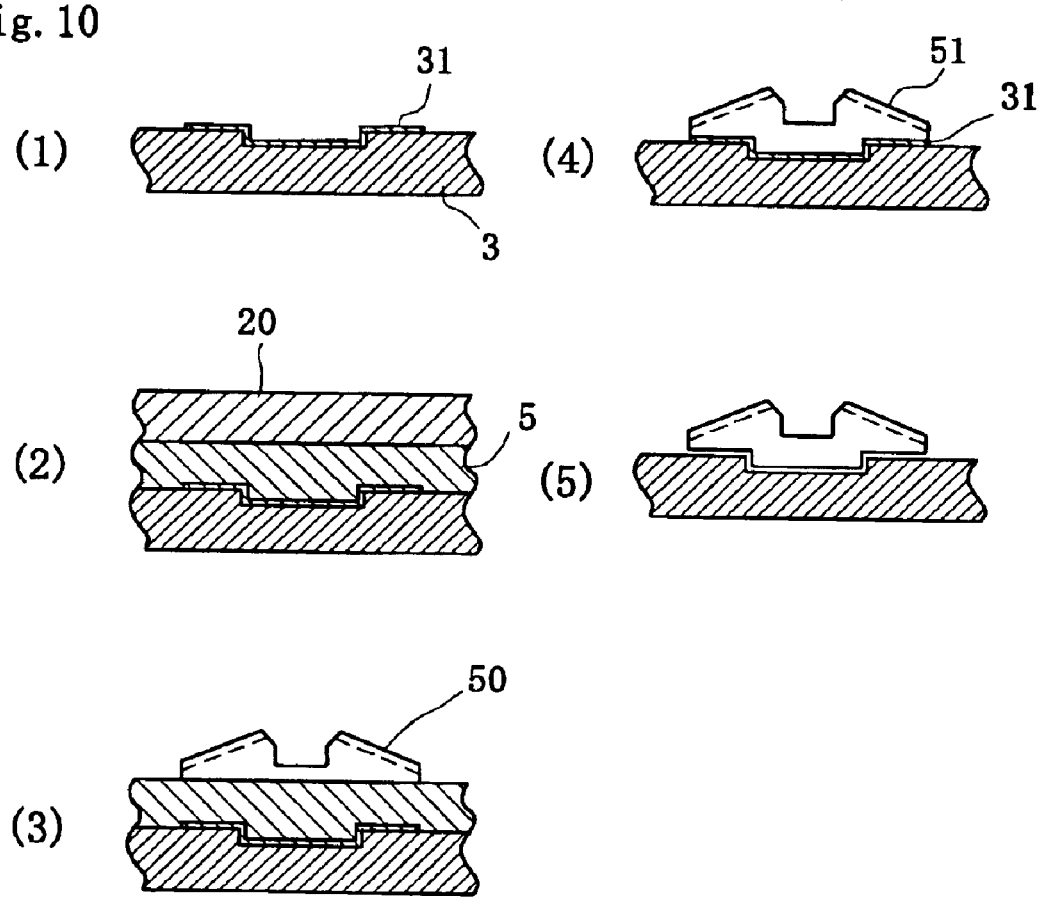
FIG. 10 is a sectional view for describing the method of manufacturing a bevel gear, the axis of rotation of which is perpendicular to a base plate surface, to be used for a micromachine in a fourth embodiment of the present invention.

In order that a gear can be rotated, a groove is formed in a base plate 3, and filled (FIG. 10(1)) with a material 31 different from those of the gear and base plate.

A material 5 for the gear is deposited on the base plate in which the groove is formed (FIG. 10(2)).

A photosensitive agent 20 is applied (FIG. 10(2)) to an upper surface of the material 5.

The photosensitive agent is exposed by an exposure value control method, to form (FIG. 10(3)) a shape 50 of a bevel gear.

A transfer etching operation is carried out to form (FIG. 10(4)) a bevel gear 51.

The material 31 existing between the base plate and gear is removed, to make a bevel gear (FIG. 10(5)).

(Fifth Embodiment)

Figure 11:
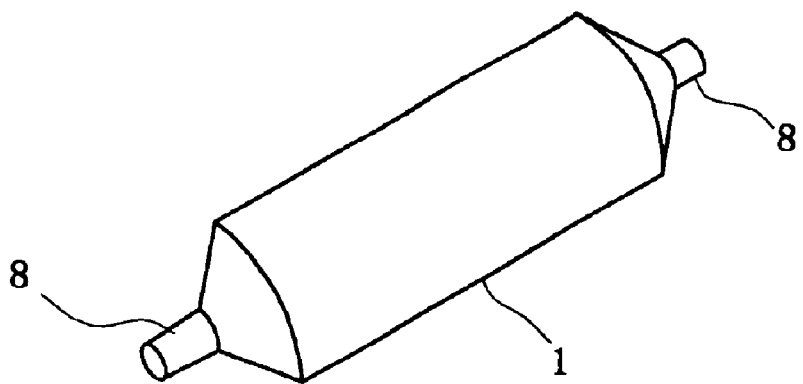
FIG. 11 is a perspective view for describing a gear, the axis of rotation of which is inclined with respect to a base plate surface, to be used for a micromachine in a fifth embodiment of the present invention.

A method of manufacturing a gear the axis of rotation is inclined with respect to a base plate surface will be described. FIG. 11 is a perspective view showing a contour of a gear 1 the rotary shafts 8 of which are inclined with respect to a base plate surface. This embodiment is applied to a worm, a spur gear and a bevel gear the axes of rotation of which are inclined with respect to base plate surfaces.

Figure 12:
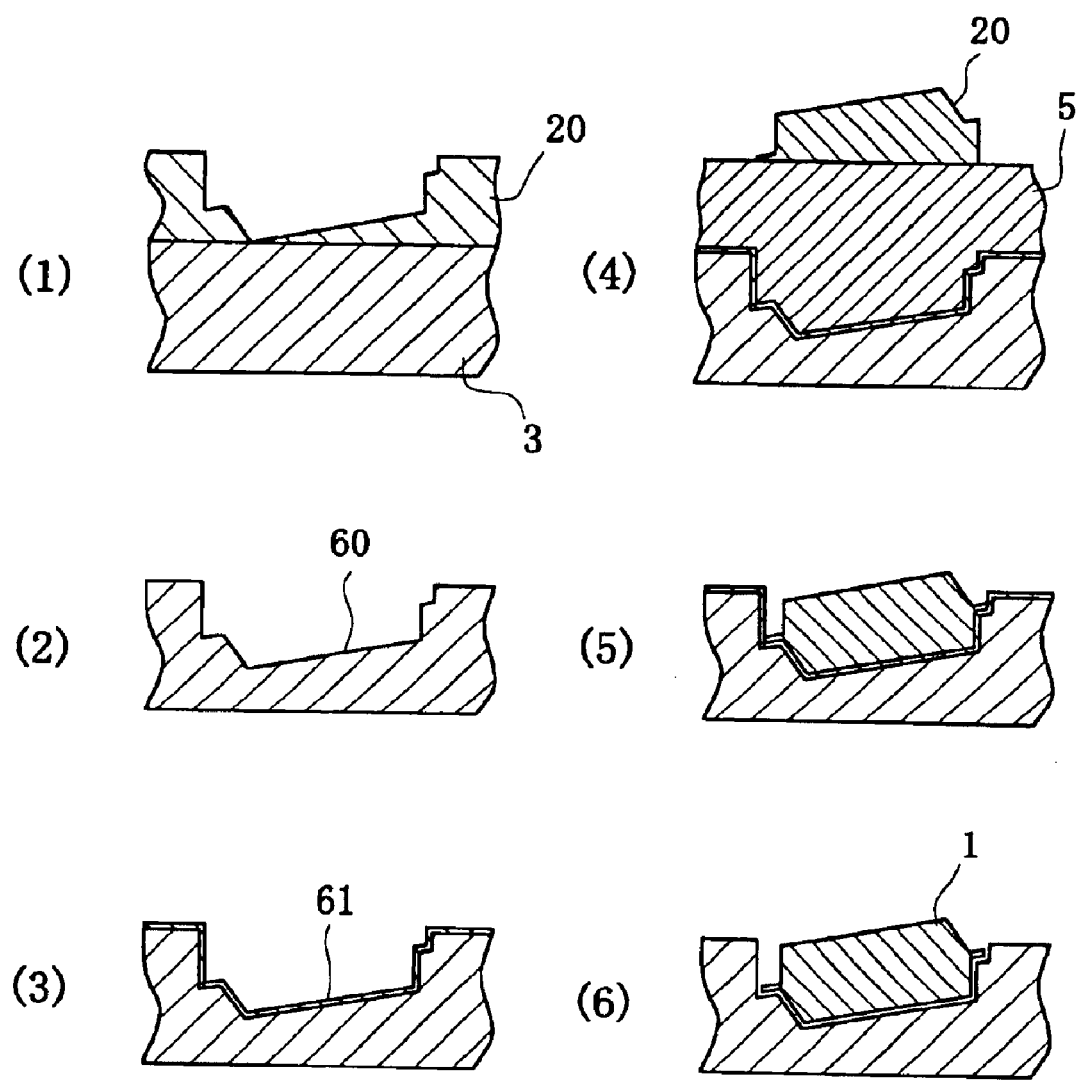
FIG. 12 is a sectional view for describing the method of manufacturing the gear, the axis of rotation of which is inclined with respect to a base plate surface, to be used for a micromachine in the fifth embodiment of the present invention.

A resist 20 is applied to an upper surface of a base plate 3 or a material, which is other than the base plate, formed on the base plate (FIG. 12(1)).

The base plate 3 is etched back, and the shape 60 of the resist is transfer etched (FIG. 12(2)) on the base plate (ground material).

A film 61 of a material different from that of the base plate 3 is formed (FIG. 12(3)) on an outer surface of the base plate 3.

A material 5 for the gear is deposited on the base plate 3, and a resist 20 is applied (FIG. 12(4)) to an upper surface of the material 5.

The base plate 3 is etched back, and the shape of the resist is transfer etched (FIG. 12(5)) on the base plate 3.

The film 61 formed in the step of FIG. 12(3) is etched to remove (FIG. 12(6)) the same.

Figure 13:
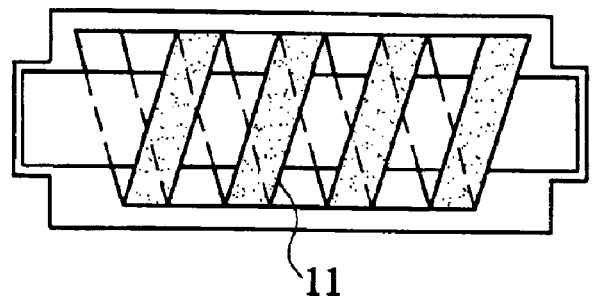
FIG. 13 shows the completion of a magnetic gear or an electrostatic gear for a micromachine in another embodiment of the present invention, and is a plan view showing a worm gear the axis of rotation of which is horizontal with respect to a base plate surface.
Figure 14:
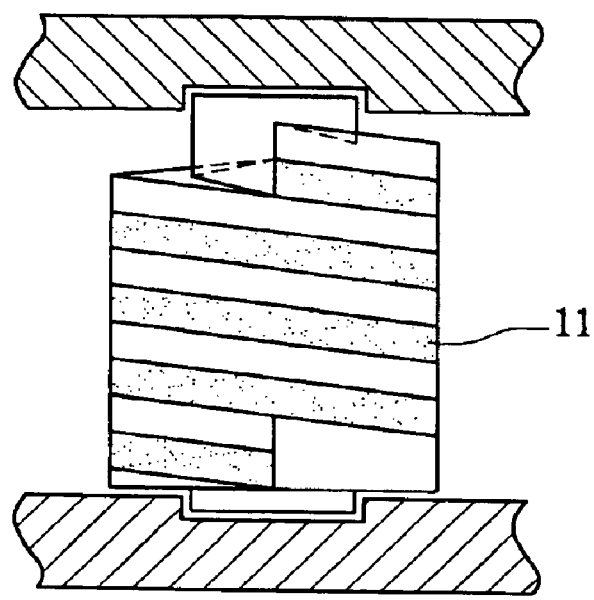
FIG. 14 shows the completion of a magnetic gear or an electrostatic gear for a micromachine in another embodiment of the present invention, and is a side view of a worm gear the axis of rotation of which is horizontal with respect to a base plate surface.
Figure 15:
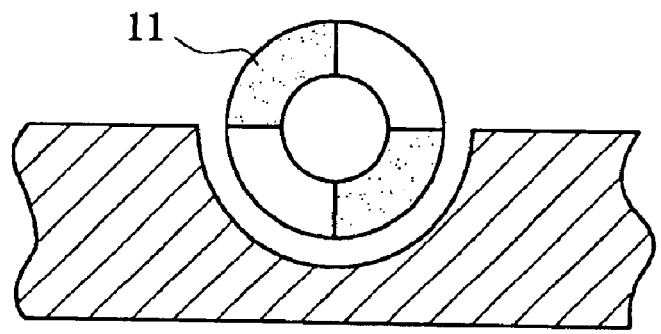
FIG. 15 shows the completion of a magnetic gear or an electrostatic gear for a micromachine in another embodiment of the present invention, and is a side view of a spur gear the axis of rotation of which is horizontal with respect to a base plate surface.
Figure 16:
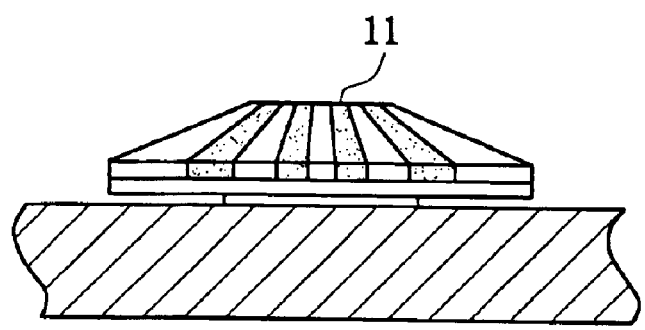
FIG. 16 shows the completion of a magnetic gear or an electrostatic gear for a micromachine in another embodiment of the present invention, and is a side view of a bevel gear the axis of which is perpendicular to a base plate surface.
Figure 18:
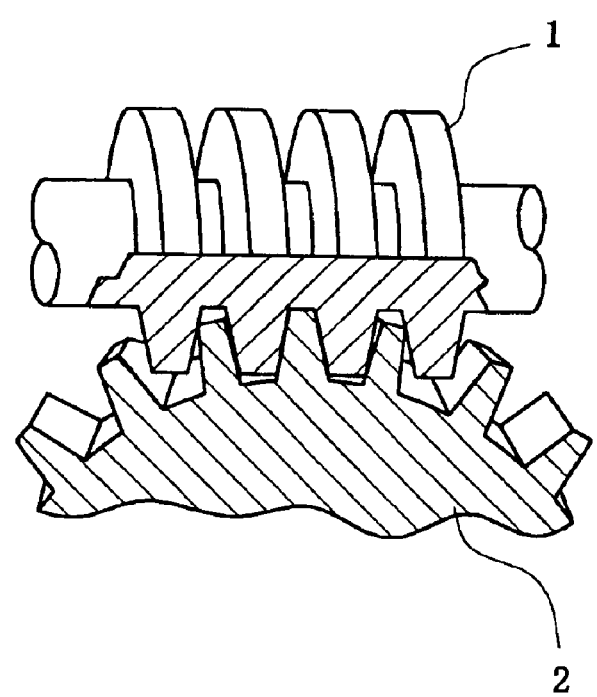
FIG. 18 is a perspective view of a combination of a worm and a worm gear.
Figure 17:
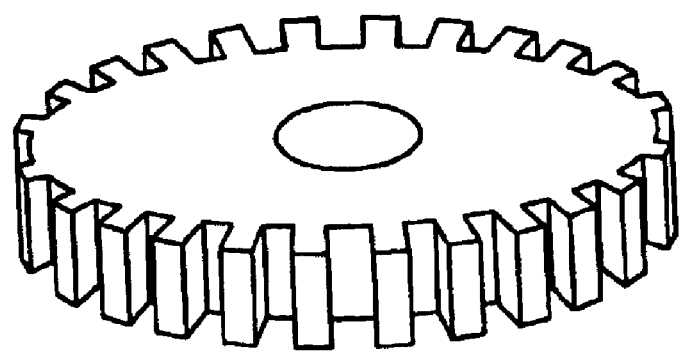
FIG. 17 is a perspective view of a spur gear the axis of rotation of which is perpendicular to a base plate surface.

The present invention includes the following modes of embodiment in addition to the gears in the above embodiments. FIG. 13 to FIG. 16 show completed examples of magnetic gears and electrostatic gears. FIG. 13 shows a worm the axis of rotation of which is horizontal with respect to a base plate surface, FIG. 14 a worm perpendicular to a base plate surface, FIG. 15 a spur gear horizontal with respect to a base plate surface, and FIG. 16 a bevel gear perpendicular to a base plate surface. Referring to these drawings, magnetic teeth are shown in a black and white intermediate color. Either a N-pole or a S-pole is provided. The N-pole and S-pole can also be arranged adjacently to each other. The electrostatic teeth can also be arranged on portions of a black and while intermediate color.

It will be added that gears which are other than the above-described gears, and which have complicated shapes, for example, various types of gears the axes of rotation of which are inclined with respect to base plate surfaces, bevel gears the axes of rotation of which are horizontal with respect to base plate surfaces, and the like can also be manufactured by using the above-mentioned exposure value control method and transfer etching method.

Industrial Applicability

As described above, the gear according to the present invention is a gear having projection type teeth on a circumferential surface thereof, or a gear having magnetic teeth on a circumferential surface thereof, or a gear having electrostatic teeth on a circumferential surface thereof. The method of manufacturing such gears according to the present invention is capable of forming gears, such as a worm gear, a spur gear, a bevel gear and the like, and also other gears having more complicated shapes, to all of which one of the above-mentioned types of teeth are applied, by using film formation techniques including vapor deposition, sputtering, plating techniques, CVD, oxidation process and the like, and fine processing techniques including photolithography, etching, FIB and the like, this method thereby enabling teeth and gear to be formed collectively in the same process. Especially, subminiature gears in the order of submicron, micron and millimeter can be manufactured as gears for micromachines. The gears according to the present invention can also be utilized as fine hole making drills formed by modifying worms.

What is claimed is:

1. A method of manufacturing a worm gear system, said system including a worm gear having an outer surface, and a base plate having a top surface, wherein said gear has an axis of rotation that is horizontal with respect to said top surface of said base plate;

said system having a clearance portion between said gear and said base plate so that said gear can be rotated, said clearance portion having an outer surface defining said top surface of said base plate and an inner surface defining said outer surface of said gear;

the method comprising the steps of:

providing a first material for forming said base plate;

applying a first photosensitive agent onto said base plate upper surface;

applying an exposure value control method (EVCM) to said first photosensitive agent for forming a first shape defining said bottom surface of said clearance portion;

transfer etching said first shape onto said top surface of said base plate, wherein said first photosensitive agent is used as a mask;

depositing a second material for forming said clearance portion, said second material being different from said base plate, said second material being deposited after completing said transfer etching method;

removing excess second material, wherein said excess includes material that is not required for forming said clearance portion;

applying a second photosensitive agent to said base plate upper surface;

applying an EVCM to said second photosensitive agent for forming a second shape defining said inner surface of said clearance portion;

transfer etching said second shape onto said second material, wherein said second photosensitive agent is used as a mask;

depositing a third material for forming said gear onto said base plate;

applying a third photosensitive agent to an upper surface of said deposited gear material;

applying an EVCM to said third photosensitive agent for forming a third shape defining an upper half of said gear;

transfer etching said third shape onto said gear material, wherein said third photosensitive agent is used as a mask; and removing any excess said third material from said clearance portion.

2. A method of manufacturing a worm gear system, said system having a worm gear, said gear including a plurality of helical turns, at least a first grove portion, and at least a first projection and a central portion;

said system having bottom and top base plates, said bottom base plate having a top surface and said top base plate having a bottom surface, said gear having an axis of rotation that is perpendicular to said top surface of said bottom base plate;

said system having bottom and top bearing portions and bottom and top clearance portions between said gear and respective bottom and top base plates, said bottom and top bearing portions and said bottom and top clearance portions each having a top surface;

the method comprising the step of:

providing said bottom base plate;

forming said bottom bearing portion and said bottom clearance portion on said top surface of said bottom base plate;

depositing a first material for forming said gear onto both of said top surface of said bottom bearing portion and said bottom clearance portion and said top surface of said bottom base plate;

depositing a first photosensitive agent onto said first material to a thickness corresponding to a first helical turn of said gear;

applying an exposure value control method (EVCM) to said first photosensitive agent for forming a first shape defining said first helical turn;

transfer etching said shape of first helical turn onto said gear material, wherein said first photosensitive agent is used as a mask;

forming said first groove of said gear by:

1) depositing a second material, different from said first material, onto said first material;

2) depositing a second photosensitive agent onto said second material;

3) depositing a resist onto said second photosensitive agent;

4) using said second photosensitive agent as a mask and applying photolithography to draw a ring-type pattern on said mask for transferring said pattern onto said second material; and 5) removing said resist;

forming said first projecting portion and central portion of said gear by:

1) depositing a third material for forming said gear onto said grove to a thickness corresponding to that of a second helical turn;

2) depositing a third photosensitive agent onto said third material, to a thickness corresponding to that of said second helical turn;

3) applying an exposure value control method (EVCM) to said third photosensitive agent for forming a second shape defining said second helical turn; and 4) transfer etching said second shape onto said third material;

forming a gear laminate of a desired height by successively forming grooves, projecting portions and central portions;

depositing a forth material onto said gear laminate for forming said upper bearing and clearance portion;

providing said top base plate;

depositing said bottom surface of said top base plate onto said top surface of said top bearing and clearance portion; and removing said top and bottom clearance material portions.

3. A method of manufacturing a spur gear system, said system having a spur gear and a base plate, said base plate having a top surface, said spur gear having an axis of rotation that is horizontal with respect to said top surface of said base plate;

said system having a clearance portion between said gear and said base plate so that said gear can be rotated;

said method comprising the steps of:

providing said base plate;

forming a groove in said base plate;

filling said base plate groove with a first material for forming said clearance portion, wherein said first material is different from said gear and base plate;

applying a first photosensitive agent onto said top surface of said base plate and onto said clearance portion;

applying an exposure value control method (EVCM) to said first photosensitive agent for forming a first shape defining a lower half of said spur gear;

transfer etching said first shape onto said first material;

depositing a second material defining said gear onto said first material;

applying a second photosensitive agent onto said second material;

applying an EVCM to said second photosensitive agent for forming a second shape defining an upper half of said gear;

transfer etching said second shape onto said second material; and removing said clearance portion.

4. A method of manufacturing a bevel gear system, said system having a bevel gear and a base plate, said base plate having a top surface, said bevel gear having an axis of rotation that is perpendicular to said top surface of said base plate;

said method comprising the steps of:

providing said base plate;

forming a groove in said base plate;

depositing a first material for forming a clearance portion onto said groove, said first material being different from said gear and said base plate;

depositing a second material for different from said gear onto said base plate upper surface and onto said first material;

depositing a photosensitive agent onto said second material;

applying an exposure value control method (EVCM) to said photosensitive agent for forming a first shape defining said bevel gear;

transfer etching said first shape onto said gear material; and removing any excess said second material from said clearance portion.

* * * * *